(12) United States Patent
Seefeldt

(10) Patent No.: US 8,194,889 B2
(45) Date of Patent: Jun. 5, 2012

(54) HYBRID DIGITAL/ANALOG LOUDNESS-COMPENSATING VOLUME CONTROL

(75) Inventor: Alan Jeffrey Seefeldt, San Francisco, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 386 days.

(21) Appl. No.: 12/448,339

(22) PCT Filed: Dec. 17, 2007

(86) PCT No.: PCT/US2007/025747
§ 371 (c)(1),
(2), (4) Date: Jun. 17, 2009

(87) PCT Pub. No.: WO2008/085330
PCT Pub. Date: Jul. 17, 2008

(65) Prior Publication Data
US 2009/0290727 A1    Nov. 26, 2009

Related U.S. Application Data

(60) Provisional application No. 60/878,229, filed on Jan. 3, 2007.

(51) Int. Cl.
*H03G 3/20* (2006.01)
(52) U.S. Cl. .......... 381/107; 381/103; 381/104; 381/98; 381/119
(58) Field of Classification Search .............. 381/98, 381/102, 103, 104, 107, 109, 99, 119
See application file for complete search history.

(56) References Cited

U.S. PATENT DOCUMENTS

| | | | | |
|---|---|---|---|---|
| 5,377,277 A | | 12/1994 | Bisping | |
| RE34,961 E | | 6/1995 | Widin et al. | |
| 5,633,981 A | * | 5/1997 | Davis | 704/230 |
| 5,883,963 A | * | 3/1999 | Tonella | 381/104 |
| 6,088,461 A | * | 7/2000 | Lin et al. | 381/104 |
| 6,108,431 A | * | 8/2000 | Bachler | 381/312 |
| 6,370,255 B1 | * | 4/2002 | Schaub et al. | 381/107 |
| 6,442,281 B2 | * | 8/2002 | Sato et al. | 381/102 |
| 6,445,734 B1 | * | 9/2002 | Chen et al. | 375/231 |
| 6,826,286 B1 | * | 11/2004 | Arndt et al. | 381/312 |

(Continued)

FOREIGN PATENT DOCUMENTS

EP    1 387 487 A    2/2004

(Continued)

OTHER PUBLICATIONS

Notification of Transmittal of the International Search Report and the Written Opinion of the International Searching Authority, or the Declaration, PCT/US2007/025747, Apr. 14, 2008.

(Continued)

Primary Examiner — Davetta W Goins
Assistant Examiner — Kuassi Ganmavo

(57) ABSTRACT

A loudness-compensating volume control method imposes a desired loudness scaling on an audio signal by processing the audio signal in both the digital and analog domains by receiving a desired loudness scaling, deriving a wideband gain component and one or more other gain components from the desired loudness scaling, applying in the digital domain modifications to the audio signal based on the one or more other gain components to produce a partly-modified audio signal, and applying in the analog domain modifications to the partly-modified audio signal based on the wideband gain component. Additional loudness modifications other than volume control loudness modifications on the audio signal may also be imposed.

7 Claims, 3 Drawing Sheets

U.S. PATENT DOCUMENTS

| | | | | |
|---|---|---|---|---|
| 2002/0076072 A1* | 6/2002 | Cornelisse | | 381/312 |
| 2003/0063763 A1* | 4/2003 | Allred et al. | | 381/314 |
| 2004/0213420 A1* | 10/2004 | Gundry et al. | | 381/104 |
| 2004/0240684 A1* | 12/2004 | Cerasuolo et al. | | 381/104 |
| 2006/0126866 A1* | 6/2006 | Falcon | | 381/104 |

FOREIGN PATENT DOCUMENTS

| | | |
|---|---|---|
| JP | 07 050895 A | 2/1995 |
| JP | H07-122953 | 5/1995 |
| JP | 2003-168940 | 6/2003 |
| WO | WO 2006/047600 A | 5/2006 |
| WO | WO 2008/085330 | 7/2008 |

OTHER PUBLICATIONS

Australian Government IP Australia, Examiner's first report on patent application No. 2005299410, mailed Jun. 25, 2009, Australian Patent Appln. No. 2005299410.

Israel Patent Office, Examiner's Report on Israel Application No. 182097 mailed Apr. 11, 2010, Israel Patent Appln. No. 182097.

Intellectual Property Corporation of Malaysia, Substantive/Modified Substantive Examination Adverse Report (Section 30(1)/30(2)) and Search Report, dated Dec. 5, 2008, Malaysian Patent Appln. No. PI 20055232.

Dept of Justice & Human Rights of Republic of Indonesia, Directorate General Intellectual Property Rights, First Office Action received Apr. 22, 2010, Indonesian Patent Appln. No. WO0200701285.

State Intellectual Property Office of the People's Republic of China, Notification of the Third Office Action, mailed Apr. 21, 2010, China Patent Appln. No. 200580036760.7.

European Patent Office Searching Authority, Int'l Search Report and Written Opinion, Int'l Appln. No. PCT/US2004/016964, mailed Jun. 20, 2005.

* cited by examiner

HYBRID DIGITAL/ANALOG LOUDNESS-COMPENSATING VOLUME CONTROL

TECHNICAL FIELD

The invention relates to audio signal processing. In particular, the invention relates to audio signal processing in which loudness-compensating volume control is performed in a hybrid digital-domain and analog-domain manner. The invention may be practiced in a method, an apparatus practicing a method, or a computer program for implementing a method.

REFERENCES AND INCORPORATION BY REFERENCE

Certain techniques for measuring and adjusting perceived (psychoacoustic) loudness useful in better understanding aspects the present invention are described in published International patent application WO 2004/111994 A2, of Alan Jeffrey Seefeldt et al, published Dec. 23, 2004, entitled "Method, Apparatus and Computer Program for Calculating and Adjusting the Perceived Loudness of an Audio Signal" and in "A New Objective Measure of Perceived Loudness" by Alan Seefeldt et al, Audio Engineering Society Convention Paper 6236, San Francisco, Oct. 28, 2004. Said WO 2004/111994 A2 application and said paper are hereby incorporated by reference in their entirety.

Certain other techniques for measuring and adjusting perceived (psychoacoustic) loudness useful in better understanding aspects the present invention are described in published International patent application WO 2006/047600 A1 of Alan Jeffrey Seefeldt, published May 4, 2006, entitled "Calculating and Adjusting the Perceived Loudness and/or the Perceived Spectral Balance of an Audio Signal." Said WO 2006/047600 A1 application is hereby incorporated by reference in its entirety.

Yet certain other techniques for measuring and adjusting perceived (psychoacoustic) loudness useful in better understanding aspects the present invention, particularly in a multichannel environment, are described in published International patent application WO 2007/123608 A1, of Alan Jeffrey Seefeldt et al, published Nov. 1, 2007 entitled "Loudness Modification of Multichannel Audio Signals." Said-WO 2007/123608 A1 application is hereby incorporated by reference in its entirety.

BACKGROUND ART

The human perception of loudness has been studied for several decades, and accordingly many properties of this perception have been discovered and subsequently modeled. In the 1930's Fletcher and Munson found that at low signal levels, middle frequencies are perceived as louder than lower and higher frequencies but that this variation in sensitivity decreases as the level of sound increases. In the 1950's Zwicker and Stevens built on the work of Fletcher and Munson and developed more accurate and realistic models. FIG. 1, published by E. Zwicker in "Psychoacoustics," (Zwicker's FIG. 8.4) shows the growth of loudness of both a 1 kHz tone and Uniform Excited Noise ("UEN"—noise with equal power in all critical bands). For a signal level below what is often termed the "bearing threshold," no loudness is perceived. Above this threshold, there is a quick rise in perceived loudness up to an asymptote where loudness grows linearly with signal level. In FIG. 2 the equal loudness contours of ISO 226 show the same behavior, but as a function of frequency for sinusoidal tones. The contour lines, at increments of 10 phon show the sound pressure levels across frequency that the human ear perceives as equally loud. The lowest line represents the "hearing threshold" as a function of frequency.

The non-linear and frequency varying behavior of the human auditory system has a direct impact on the perceived timbre and imaging of audio signals. A complex, wideband audio signal, for example music, presented at a particular sound pressure level is perceived as having a particular spectral balance or timbre. If the same audio signal is presented at a different sound pressure level, the perceived spectral balance or timbre of the audio signal is different because, as shown in FIG. 2, the growth of perceived loudness is different for different frequencies.

A complex, wideband multichannel audio signal, presented over multiple loudspeakers, is also perceived as having a particular spatial balance. Spatial balance refers to the impression of the location of sound elements in the mix as well as the overall diffuseness of the mix due to the relative level of audio signals between two or more loudspeakers. If the same multichannel audio signal is presented at a different overall sound pressure level, the non-linear growth in perceived loudness and differing growth of loudness across frequency leads to a change in the perceived spatial balance of the multichannel audio signal. This effect is especially apparent when there is a significant difference in level between channels. Quieter channels are affected differently than louder channels which, for example, can lead to quiet channels dropping below the hearing threshold and audibly disappearing when the overall level is reduced.

In many situations there is a desire to adjust or scale the perceived loudness of an audio signal. The most obvious example is the traditional volume control that appears on many devices including consumer music players, home theater receiver/amplifiers and professional mixing consoles. The traditional simple volume or level control adjusts the audio signal by applying the same wideband gain applied to all channels without any consideration of the human auditory system and the resulting change in perceived timbre and spatial balance.

Recently Seefeldt in said WO 2006/047600 A1 published application and Seefeldt et al in said WO 2007/123608 A1 published application proposed a method that enables accurate scaling of the perceived loudness of monophonic and multichannel audio signals which maintains the perceived timbre and spatial balance as the loudness is scaled. In this method, a desired loudness scaling or target loudness is achieved by, in essence, inverting a psychoacoustic loudness measurement model and calculating frequency and time variant gains that can be applied to the audio signal. For the case of a volume control, a particular setting of the control corresponds to a fixed scaling of the perceptual loudness spectrum, referred to as specific loudness, and the gains are computed to achieve a target specific loudness equal to the original specific loudness of the audio multiplied by the scaling.

Scaling of specific loudness is most easily implemented in the digital domain where transforms may be utilized to divide the audio into the requisite critical bands for which the gains are computed and applied. The loudness-scaled digital audio may then be transformed into an analog signal using a digital-to-analog converter and then played back through an amplifier and speakers. FIG. 3 depicts a block diagram of such a loudness-compensating process or device. Digital audio is applied to a volume control process or volume controller ("Digital Loudness Compensating Volume Controller") 2 that has a desired volume setting ("Volume Selection"), as an input from a user, for example. The process or device 2 computes and applies frequency and time variant gains to achieve the specific loudness scaling corresponding to a Volume Selection setting. Such a process or device may be implemented in accordance with the teachings of one or more of said above-cited patent applications of Seefeldt and Seefeldt et al. The modified digital audio is then converted to analog using a digital-to-analog conversion process or converter ("D/A") 4.

Any practical digital implementation utilizes a limited bit depth to represent the audio signal (16 bits, for example, for Compact Disc audio). As the desired volume, or loudness scaling, is decreased, the resulting gains applied to the signal also decrease. Accordingly, the average level of the modified digital audio approaches the noise floor corresponding to the bit depth. If the modified audio is simply re-quantized after the attenuation, audible distortion may result. With a slight increase in computational complexity, the audio may be re-dithered with a white dither noise to remove distortion. Audibly, the dither introduces a constant white noise at approximately the level of the least significant bit of the digital representation. For 16-bit audio, this level corresponds to approximately 96 dB below full scale. However, the perceptual dynamic range of human hearing is significantly greater, approximately 120 dB. Thus, the still-audible attenuated audio may approach or even fall below the quantization noise floor, resulting in a low signal-to-noise (SNR) listening condition. A noise shaper may be used to move the dither noise to less perceptible areas of the spectrum, effectively reducing the level of the dither noise below the threshold of hearing. Such noise-shaping processes are computationally expensive, requiring high-precision arithmetic, and may not be practical in a consumer device.

Thus, there is a need for a loudness-compensating volume control that provides the functionality of digitally-implemented loudness compensation while reducing the problems associated with all-digital implementations thereof.

DISCLOSURE OF THE INVENTION

Figure 1:
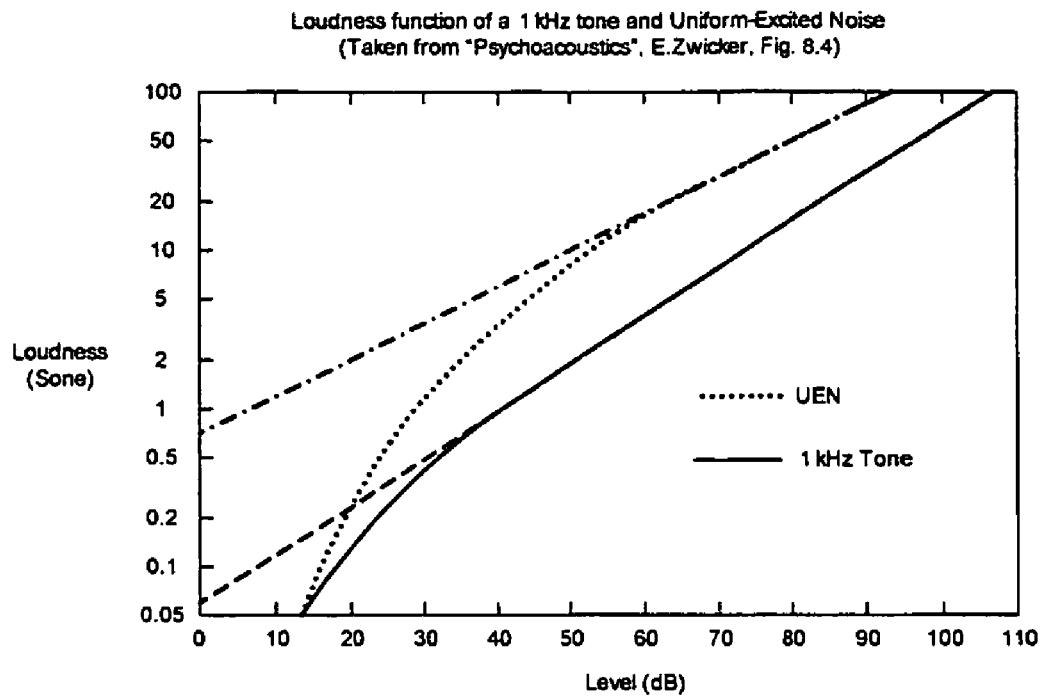
FIG. 1 shows the loudness function (loudness in sone versus level in dB) of a 1 kHz tone and of noise with equal power in all bands.

In accordance with an aspect of the present invention, a loudness-compensating volume control method for imposing a desired loudness scaling on an audio signal by processing the audio signal in both the digital and analog domains, the loudness scaling having a wideband gain component and one or more other gain components, comprises applying in the digital domain modifications to the audio signal based on the one or more other gain components to produce a partly-modified audio signal, and applying in the analog domain modifications to the partly-modified audio signal based on the wideband gain component. The resulting modified audio signal may have a loudness scaling closer to the desired loudness scaling than to that of the audio signal prior to applying modifications in the digital and analog domains.

In accordance with another aspect of the invention, a loudness-compensating volume control method for imposing a desired loudness scaling on an audio signal by processing the audio signal in both the digital and analog domains, comprises receiving a desired loudness scaling, deriving a wideband gain component and one or more other gain components from said desired loudness scaling, applying in the digital domain modifications to the audio signal based on said one or more other gain components to produce a partly-modified audio signal, and applying in the analog domain modifications to the partly-modified audio signal based on said wideband gain component. The resulting modified audio signal may have a loudness scaling closer to the desired loudness scaling than to that of the audio signal prior to applying modifications in the digital and analog domains.

According to aspects of the present invention, a loudness compensating volume control process or controller performs certain functions in the analog domain and other functions in the digital domain. For example, frequency- and time-variant equalization may be performed in the digital domain and wideband level or gain adjustments may be performed in the analog domain. One advantage of such a hybrid digital/analog approach is that the signal-to-noise ratio of the original digital signal may be substantially retained without complex perceptual noise reducing processing.

According to aspects of the present invention, a traditional analog wideband volume control process or controller may be employed in conjunction with a digital loudness compensating volume control process or controller. By "wideband" is meant that substantially the same scaling is applied to all frequencies in the audio signal being processed by the volume control process or controller. Suitable digital processes and processors include the methods and devices described in the above-cited patent applications. The analog volume control process or controller may be used to apply the wideband gain component associated with a desired loudness scaling, while the digital control process or controller may be used to apply the remaining gain components not provided by the analog process or device, such as frequency- and time-varying portions ("equalization" portions) of the desired loudness scaling.

According to aspects of the present invention, loudness modifications other than wideband gain are applied to the audio signal in the digital domain before wideband gain modifications are applied to the audio signal in the analog domain. By not applying the wideband gain modification to the audio signal in the digital domain and applying only the loudness modifications other than the wideband gain in the digital domain prior to applying the wideband gain modifications in the analog domain, the average level of the modified digital signal remains relatively unchanged, regardless of the setting of the volume control. The problem of a noise floor does not exist in the analog domain where wideband gain changes are applied to the audio signal. Therefore, the signal-to-noise ratio of the original digital audio signal may be substantially maintained throughout its modification in the digital domain, its subsequent conversion to the analog domain, and its wideband gain modification in the analog domain. Modification in the digital domain may be carried out, for example, using 24- or 32-bit precision and the modified digital audio may be re-quantized to 16-bit before application to D/A 8. Such re-quantization may not require the use of dither or may require only a simple non-shaped white dither noise. The details of such modification in the digital domain and conversion to the analog domain are not critical to the invention. As discussed below, the analog wideband gain may be modified so that the equalization performed in the digital domain does not result in clipping.

Figure 4A:
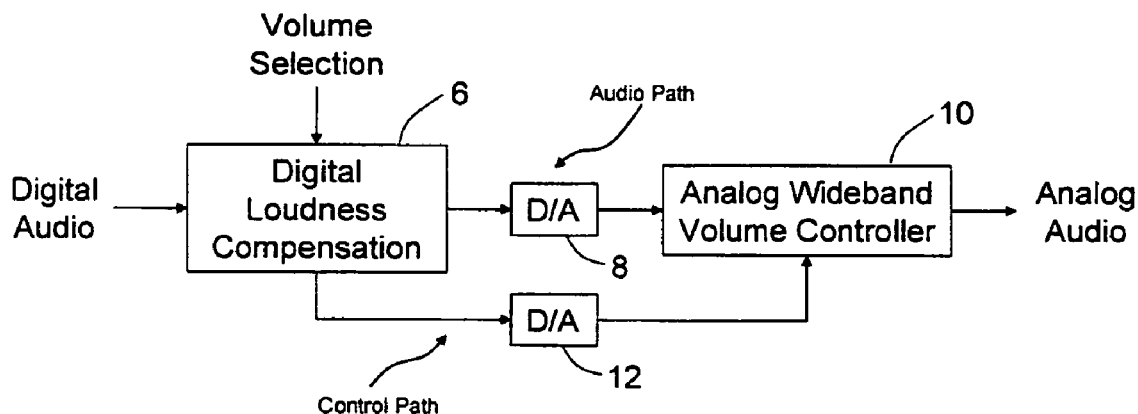
FIGS. 4*a* and 4*b* are schematic functional block diagrams showing alternative exemplary embodiments of a loudness-compensating volume controller or controller process according to the present invention in which both digital and analog processing are advantageously employed.
Figure 4B:
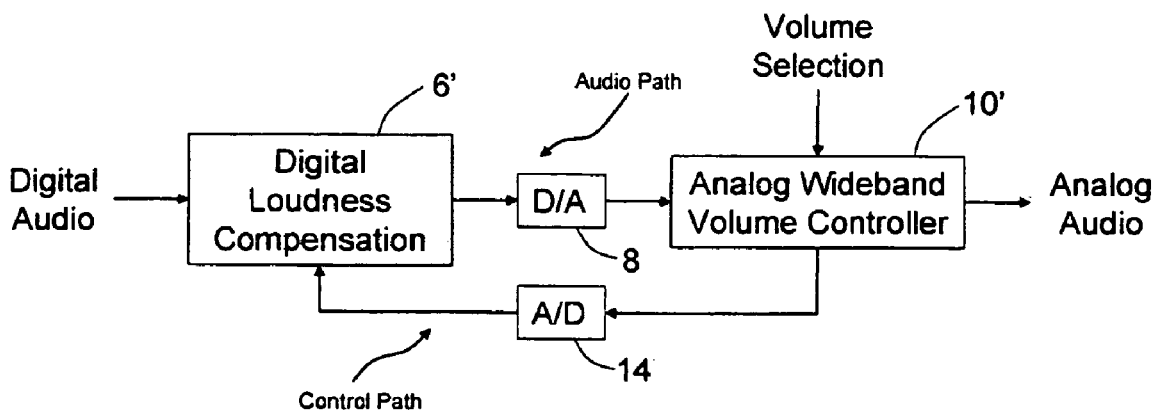

FIGS. 4a and 4b depict generally two alternative exemplary embodiments of the present invention. In FIG. 4a, a user or some other selection device or process may select a desired volume level ("Volume Selection") that serves as an input to a digital loudness compensation process or controller ("Digital Loudness Compensation") 6. A particular Volume Selection setting corresponds or maps, in accordance with a mapping function, to a fixed scaling of the perceptual loudness spectrum, referred to as specific loudness. A further mapping function may be used to extract from the loudness scaling its wideband gain component and the components that remain when the wideband gain component is removed from the loudness scaling (such other components may be characterized as "equalization" components). Mapping functions in function or controller 6 may employ lookup tables, for example. The loudness scaling to wideband gain mapping may be based, for example, on Equations 5a or 5b, set forth and described below. The determination of components other than the wideband gain component may be based, for example, on Equation 6, set forth and described below.

The digital process or controller 6 applies to the audio signal in the digital domain whatever modifications are necessary to achieve the desired loudness scaling or target specific loudness other than application of the computed wideband gain. This may be accomplished, for example, by computing gains and applying them to critical bands through the use of transforms in the manner, for example, of said WO 2006/047600 A1 published application and/or said WO 2007/123608 A1 published application. Alternatively, filter coefficients may be calculated and applied to an FIR filter to which the audio signal is applied. The resulting partly-modified digital audio is subsequently converted to an analog signal by a digital-to-analog converter or conversion process ("D/A") 8 and passed to an analog wideband volume control process or controller ("Analog Wideband Volume Controller") 10 along an upper audio path, a signal path. The Analog Wideband Volume Controller 10 may employ a voltage-controlled amplifier (VCA) and its gain may be set with an analog control signal. The computed wideband gain is converted to an analog signal by a digital-to-analog converter or conversion process ("D/A") 12 and sent to the control process or controller 10 via a lower path, a control path, in order to set its gain at the desired value. The analog volume controller then modifies the incoming audio with the wideband gain to generate the modified analog audio. The resulting modified analog signal substantially preserves the signal-to-noise ratio of the original digital audio signal.

FIG. 4b depicts an alternative, essentially equivalent implementation in which the volume may be set, such as by a user or some other selection device or process, at a Volume Selection input of an Analog Wideband Volume Controller 10'. Process or device 10' may differ from process or device 10 of FIG. 4a in that it has a Volume Selection input and, in this example, the Volume Selection input setting corresponds or maps to the wideband gain that the device or process 10' applies to the input audio signal it receives from D/A 8. The wideband gain value is converted from analog to digital in an analog-to-digital conversion process or converter 14 and fed back to a Digital Loudness Compensation process or device 6' via the lower control path. Process or device 6' is similar to process or device 6 except that it employs the inverse of the above-described mapping process to transform the wideband gain to a corresponding loudness scaling and to derive the scaling components other than the wideband gain.

As discussed further below, in addition to loudness modifications applied to the audio signal in response to the Volume Selection of FIG. 4a or FIG. 4b, other loudness modifications may be applied simultaneously such as dynamic range control and dynamic equalization, as described in said WO 2006/047600 A1 published application. Such additional loudness modifications may also be separated respectively into a wideband loudness component and a component or components other than wideband loudness and used along with control signals derived from the Volume Selection input to control the digital and analog signal modifications.

BEST MODE FOR CARRYING OUT THE INVENTION

A more detailed exemplary embodiment will now be described in the context of the digital loudness modification systems disclosed in said WO 2006/047600 A1 published application and/or in said WO 2007/123608 A1 published application in which a target specific loudness is computed and corresponding gains are applied to each critical band through the use of transforms. However, implementations of the present invention may employ other digital implementations of a loudness compensating volume controller in conjunction with an analog wideband volume controller. For example, an alternative digital embodiment might employ a time-varying FIR filter to impart signal modifications other than the wideband gain modification.

Figure 5:
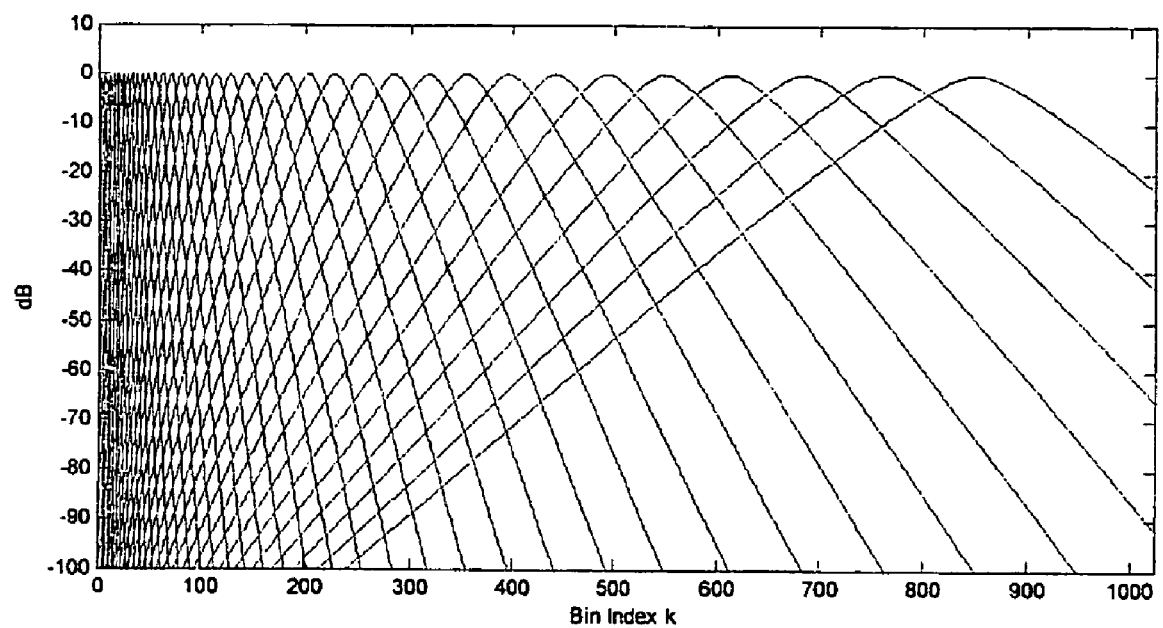
FIG. 5 is a set of critical-band filter responses.

A preferred embodiment will now be described with respect to a monophonic audio signal, but the invention may be extended to process multichannel audio by employing teachings in said WO 2007/123608 A1 published application. In the Digital Loudness Compensation 6 and 6', the specific loudness, a measure of perceptual loudness distributed across frequency and time, of a monophonic digital audio signal x[n] may be computed through the following steps. First, an excitation signal E[b,m] may be computed that approximates the distribution of energy along the basilar membrane of the inner ear at critical band b during time block m. This excitation signal may be computed from the Short-time Discrete Fourier Transform (STDFT) of the audio signal as follows:

$$E[b, m] = \lambda_b E[b, m-1] + (1 - \lambda_b) \sum_k |T[k]|^2 |C_b[k]|^2 |X[k, m]|^2 \quad (1)$$

where X[k, m] represents the STDFT of x[n] at time block m and bin k. T[k] represents the frequency response of a filter simulating the transmission of audio through the outer and middle ear, and $C_b[k]$ represents the frequency response of the basilar membrane at a location corresponding to critical band b. FIG. 5 depicts a suitable set of critical-band filter responses in which 40 bands are spaced uniformly along the Equivalent Rectangular Bandwidth (ERB) scale, as defined by Moore and Glasberg. (B. C. J. Moore, B. Glasberg, T. Baer, "A Model for the Prediction of Thresholds, Loudness, and Partial Loudness," *Journal of the Audio Engineering Society*, Vol. 45, No. 4, April 1997, pp. 224-240). Each filter shape is described by a rounded exponential function and the bands are distributed using a spacing of 1 ERB. Lastly, the smoothing time constant $\lambda_b$ in said WO 2004/111994 A2 published application and said Audio Engineering Society Convention Paper 6236 may be advantageously chosen proportionate to the integration time of human loudness perception within band b.

Figure 2:
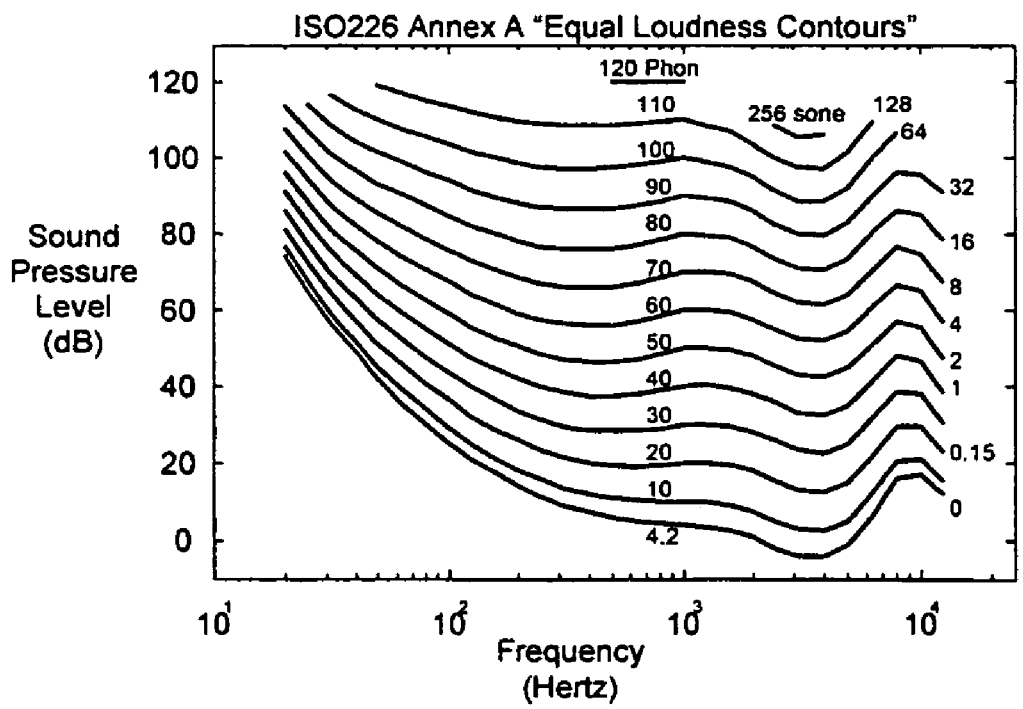
FIG. 2 is a set of equal loudness contours presented in ISO 226 Annex A (Sound Pressure Level in dB versus frequency in Hz).
Figure 3:
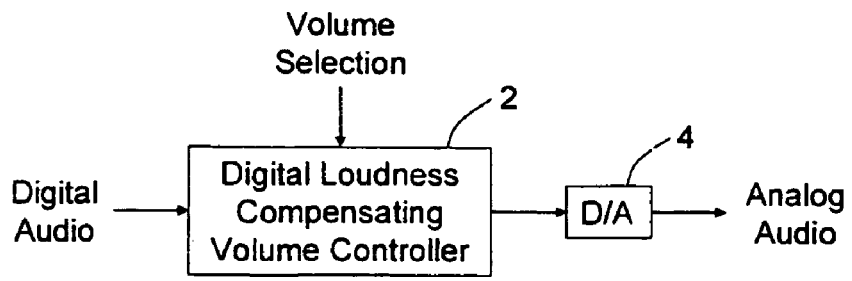
FIG. 3 is a schematic functional block diagram showing a prior art digital loudness-compensating volume controller or controller process.

Using equal loudness contours, such as those depicted in FIG. 2, the excitation at each band is next transformed into an excitation level that would generate the same loudness at 1 kHz. Specific loudness is finally computed from the transformed excitation, $E_{1\,kHz}[b, m]$, through a compressive non-linearity. One such suitable function to compute the specific loudness $N[b, m]$ is given by:

$$N[b, m] = \beta\left(\left(\frac{E_{1kHz}[b, m]}{TQ_{1kHz}}\right)^\alpha - 1\right) \quad (2)$$

where $TQ_{1\,kHz}$ is the threshold in quiet at 1 kHz and the constants $\beta$ and $\alpha$ are chosen to match growth of loudness data as shown in FIG. 1.

The Volume Selection setting corresponds to a desired scaling of the specific loudness represented by the value $s_v$. Given this scaling, the digital controller computes a multi-band gain $g[b,m]$ that, when applied to the original audio, results in a modified audio signal whose specific loudness is substantially equal to a corresponding desired target specific loudness $\hat{N}[b,m]$. This target is equal to the original specific loudness scaled by $s_v$:

$$\hat{N}[b,m] = s_v N[b,m] \quad (3a)$$

As described in said WO 2006/047600 A1 published application, one may wish to apply simultaneously other loudness modifications in addition to the volume control, such as dynamic range control and dynamic equalization. Such additional modifications may be generically represented with the band and time varying loudness scaling $s_a[b, m]$. In such a case, the desired target specific loudness is given by:

$$\hat{N}[b,m] = s_v s_a[b,m] N[b,m] \quad (3b)$$

Letting the function $F_N$ represent the transformation from excitation to specific loudness, the gain $g[b,m]$ is computed such that $$\hat{N}[b,] = F_N\{g^2[b,m] E[b,m]\} \quad (4a)$$

Rearranging (4a), one arrives at the solution $$g[b, m] = \sqrt{\frac{F_N^{-1}\{\hat{N}[b, m]\}}{E[b, m]}} \quad (4b)$$

In said WO 2006/047600 A1 published application several techniques for computing $F_N^{-1}$ in (4b) are described, including a closed form expression, a lookup table, and iterative search.

Using a mapping function $F_G$, the desired loudness scaling $s_v$ is next transformed into a corresponding wideband gain G:

$$G = F_G\{s_v\} \quad (5a)$$

The function of equation 5a may be computed using a lookup table generated, for example, from the growth of loudness curve for UEN seen in FIG. 1. Alternatively, it may be computed using the approximation that a doubling of loudness occurs for every 10 dB increase in signal level. In this case, the function is given by:

$$G = 10^{0.5\,\log 2(s_v)} \quad (5b)$$

Finally, a corrected gain $\hat{g}[b,m]$ is computed by dividing the gain $g[b,m]$ by the wideband gain G in order to pre-compensate for the subsequent application of the wideband gain in the analog domain:

$$\hat{g}[b, m] = \frac{g[b, m]}{G} \quad (6)$$

If the wideband gain G is computed as in Eqn. 5b, the corrected gain $\hat{g}[b,m]$ may be greater than one for some bands in certain cases. As a result, applying the corrected gain in the digital domain to a signal that is near full scale may result in a modified digital audio signal that clips. One way to prevent such overload is to make instead the wideband gain G a direct function of the gain $g[b,m]$. For example, it may be set equal to the maximum of $g[b,m]$ across all bands:

$$G = \max_b\{g[b, m]\} \quad (7)$$

The relationship of equation 7 guarantees that the corrected gain $\hat{g}[b,m]$ is always less than or equal to one. However, the wideband gain G is now not just a function of the user volume input, but also a function of a time-varying function of the audio signal itself. As a result, care must be taken to synchronize sufficiently the application of $\hat{g}[b, m]$ in the digital domain and G in the analog domain.

A simpler, and preferred solution is to guarantee a fixed amount of headroom in the digital processing that eliminates the introduction of any clipping. Such a result may be achieved by modifying Eqn. 5b, for example, with an offset gain that is large enough to ensure that $\hat{g}[b, m]$ is always less than one regardless of the desired loudness scaling $s_v$:

$$G = G_{offset} 10^{0.5\,\log 2(s_v)} \quad (8)$$

Regardless of how the wideband gain G is computed, the corresponding corrected gain $\hat{g}[b, m]$ is used to generate the partly-modified digital audio. This may be achieved by applying the gain in each critical band to the corresponding bins of the original STDFT to generate a modified STDFT:

$$\hat{X}[k, m] = \sum_b \hat{g}[b, m] C_b[k] X[k, m] \quad (9)$$

The modified STDFT is inverse transformed and overlapped added to produce the modified digital audio signal $\hat{x}[n]$ that is then converted through the digital-to-analog converter to the analog signal $\hat{x}(t)$. The wideband gain G is sent to the analog volume controller, which scales the signal $\hat{x}(t)$ to produce the final modified analog audio.

$$y(1) = G\hat{x}(t) \quad (10)$$

If desired, the analog audio may be converted to the digital domain.

IMPLEMENTATION

The invention may be implemented in hardware or software, or a combination of both (e.g., programmable logic arrays). Unless otherwise specified, algorithms and processes included as part of the invention are not inherently related to any particular computer or other apparatus. In particular, various general-purpose machines may be used with programs written in accordance with the teachings herein, or it may be more convenient to construct more specialized apparatus (e.g., integrated circuits) to perform the required method steps. Thus, the invention may be implemented in one or more computer programs executing on one or more programmable computer systems each comprising at least one processor, at least one data storage system (including volatile and non-volatile memory and/or storage elements), at least one input device or port, and at least one output device or port. Program code is applied to input data to perform the functions described herein and generate output information. The output information is applied to one or more output devices, in known fashion.

Each such program may be implemented in any desired computer language (including machine, assembly, or high level procedural, logical, or object oriented programming languages) to communicate with a computer system. In any case, the language may be a compiled or interpreted language.

Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

A number of embodiments of the invention have been described. Nevertheless, it will be understood that various modifications may be made without departing from the spirit and scope of the invention. For example, some of the steps described herein may be order independent, and thus can be performed in an order different from that described

The invention claimed is:

1. A loudness-compensating volume control method for applying a volume setting to an audio signal by processing the audio signal in both the digital and analog domains, comprising calculating, as a function of the volume setting $[s_v]$, a wideband gain component $[G]$, and calculating, as a function of the volume setting $[s_v]$, and the audio signal, frequency- and time-varying gain components, wherein calculating the wideband gain component and calculating the time- and frequency-varying gain components comprises determining a target specific loudness corresponding to a specific loudness of the signal scaled by said volume setting, calculating a multiband time-varying gain that when applied to the audio signal results in a modified audio signal whose specific loudness is substantially equal to said target specific loudness, calculating the wideband gain component of said multiband time-varying gain, and calculating the frequency- and time-varying gain components of said multiband time-varying gain, wherein when both gain components are applied to the audio signal, changes to the perceived spectrum are reduced when the perceived loudness is changed as a function of the volume setting, applying in the digital domain modifications to the audio signal based on said frequency- and time-varying gain components to produce a partly-modified audio signal, and applying in the analog domain modifications to the partly-modified audio signal based on said wideband gain component.

2. A loudness-compensating volume control method according to claim 1 wherein said applying in the digital domain modifications computes gains and applies them to critical bands of the audio signal.

3. A loudness-compensating volume control method according to claim 1 wherein said applying in the digital domain modifications computes filter coefficients and applies them to a time-varying FIR filter to which the audio signal is applied.

4. A loudness-compensating volume control method according to claim 1 wherein said applying in the digital domain modifications computes gains and applies them to critical bands of the audio signal.

5. A loudness-compensating volume control method according to claim 1 wherein said applying in the digital domain modifications computes filter coefficients and applies them to a time-varying FIR filter to which the audio signal is applied 6. Apparatus adapted to perform the methods of any one of claims 1, 2, 3, 4 and 5.

7. A non-transitory computer-readable storage medium encoded with a computer program for causing a computer to perform the methods of any one of claims 1, 2, 3, 4 and 5.

* * * * *